United States Patent

[11] 3,621,463

[72] Inventor Hilding Matthews Olson, Jr.
Mohnton, Pa.
[21] Appl. No. 32,191
[22] Filed Apr. 27, 1970
[45] Patented Nov. 16, 1971
[73] Assignee Bell Telephone Laboratories Incorporated
Murray Hill, N.J.

[54] NEGATIVE RESISTANCE DIODE COAXIAL OSCILLATOR WITH RESISTIVE SPURIOUS FREQUENCY SUPPRESSOR
8 Claims, 2 Drawing Figs.

[52] U.S. Cl. ........ 331/101, 331/107 R, 333/81 A, 333/82 B
[51] Int. Cl. ........ H03b 7/14
[50] Field of Search ........ 331/96, 97, 101, 107 R, 107 G, 107 T; 333/81 A, 82 R, 82 B

[56] References Cited
UNITED STATES PATENTS

| | | | |
|---|---|---|---|
| 3,231,831 | 1/1966 | Hines ........ | 331/96 |
| 3,460,055 | 8/1969 | Josenhans et al. ........ | 331/96 |

*Primary Examiner*—Roy Lake
*Assistant Examiner*—Siegfried H. Grimm
*Attorneys*—R. J. Guenther and Arthur J. Torsiglieri

ABSTRACT: A microwave oscillator circuit comprises an IMPATT diode connected to the inner conductor of a coaxial cable, a voltage source connected to the inner conductor for biasing the diode, and tuning elements in the cable defining a resonator resonant at a microwave frequency. A resistor is imbedded in the inner conductor closely adjacent to the diode, and is surrounded by an annular capacitor. Spurious low frequency oscillations are damped by the resistor, while the capacitor shunts the resistor at the output microwave frequency.

INVENTOR
H.M. OLSON JR.
BY
Roderick B. Anderson
ATTORNEY

NEGATIVE RESISTANCE DIODE COAXIAL OSCILLATOR WITH RESISTIVE SPURIOUS FREQUENCY SUPPRESSOR

BACKGROUND OF THE INVENTION

This invention relates to negative resistance oscillator circuits, and more particularly, to microwave frequency oscillators using an IMPATT diode as the active element.

The U.S. Pat. Nos. of De Loach, Jr., et al. 3,270,293 and J. G. Josenhans et al. 3,460,055, describe high frequency negative dynamic resistance diodes of the type now generally known as IMPATT diodes, which is an acronym for impact avalanche and transit time. The paper "Recent Advances in Solid State Microwave Generators" by B.C. De Loach, Jr., Advances in Microwaves, Vol. 2, 1967, Academic Press, Inc., New York, gives a qualitative description of IMPATT diode oscillators along with a comparison of their advantages over other solid-state oscillators. The paper points out that the IMPATT diode is a promising source of fairly high power microwave energy; that is, electromagnetic wave energy having frequencies in excess of about 1 gigaHertz ($10^9$ cycles per second).

Briefly, an IMPATT diode is a semiconductor diode having a PN junction and a current transit region between opposite contacts. An applied direct-current voltage biases the diode to avalanche breakdown. RF voltages at the diode terminals give rise to the formation of concentrations of charge each of which travels across the transit region in the diode within a prescribed time period. The times for charge formation and transit through the diode are arranged with respect to the resonant frequency of an external resonator such that RF current that is 180° out of phase with the RF voltage at the diode terminals flows through the resonator. Consequently, with an appropriate external resonator, this component of the current through the terminals increases as the terminal voltage decreases, thus meeting a condition for negative resistance. Ultimately, part of the DC energy applied to the diode is converted to RF energy in the resonator and the circuit constitutes an efficient solid-state microwave source.

One of the most practical ways to construct such an oscillator circuit is to mount the IMPATT diode at the end of a coaxial cable between the inner and outer conductors. A pair of movable annular tuning elements between the inner and outer conductors defines the required microwave resonator in which the diode is located. A DC source connected between the inner and outer conductors biases the diode.

One serious quality control problem in producing reliable oscillators of this type is the relatively high number of diodes that burn out when biased to only moderately high power levels. Since the physical mechanism of IMPATT diode operation within a semiconductor wafer is complicated, it is difficult to diagnose the causes of such burnout failures.

SUMMARY OF THE INVENTION

I have found that a major cause of diode burnout is the tendency of many IMPATT diodes to oscillate at frequencies in the VHF band, particularly between 50 and 150 megahertz. I have also noted that low-frequency filters in either the output circuit or the bias circuit have little or no effect on the burnout problem.

In accordance with the invention, IMPATT diode burnout is significantly reduced by imbedding a resistor which is significantly reduced by embedding a resistor which is surrounded by an annular capacitor in the coaxial cable inner conductor. Spurious low frequency oscillations are damped by the resistor, while the capacitor shunts the resistor at the output microwave frequency. Experiment has shown that with a damping resistor of this type within the resonator, and closely adjacent the diode, the low-frequency waves are effectively suppressed, and diode burnout is substantially reduced.

The resistor and capacitor combination should preferably be designed to minimize the loss of DC current biasing the diode, the output microwave loss, and to maximize the attenuation at the spurious VHF frequency. The most effective design is to make the reactance of the capacitor about equal to the shunting resistance at the VHF frequency to be suppressed.

These and other objects, features and advantages of the invention will be better understood from a consideration of the following detailed description taken in conjunction with the accompanying drawing.

DRAWING DESCRIPTION

FIG. 1 is a schematic view of an IMPATT diode oscillator in accordance with an illustrative embodiment of the invention; and FIG. 2 is an enlarged sectional view of part of the oscillator structure of FIG. 1.

DETAILED DESCRIPTION

Figure 1:
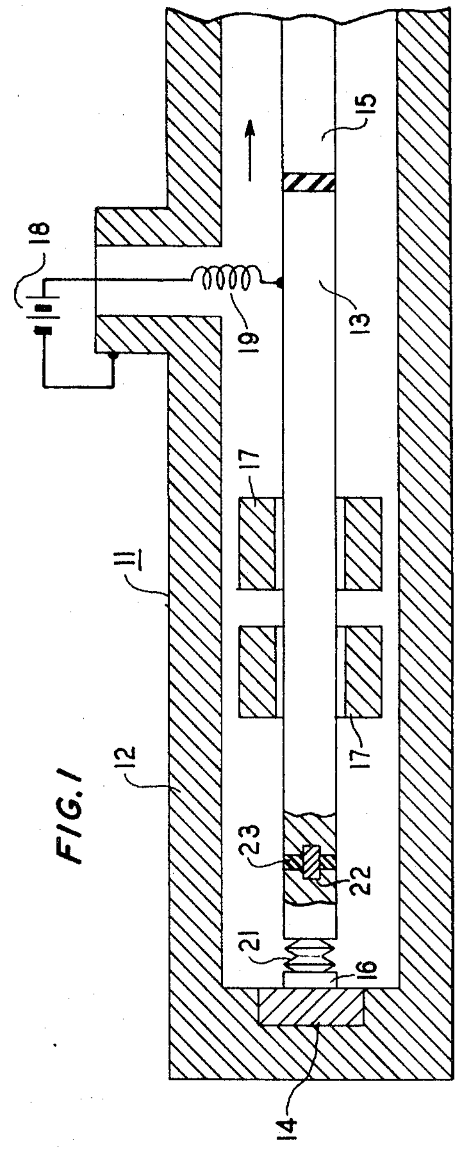

Referring now to FIG. 1, there is shown a microwave oscillator 11 in accordance with an illustrative embodiment of the invention comprising a cylindrical outer conductor 12 surrounding an inner conductor 13. The outer and inner conductors form a coaxial cable section terminated by an end wall 14 and coupled to a coaxial cable output transmission line having an inner conductor 15. An IMPATT diode package 16 is included between the terminating wall 14 and the inner conductor 13. The volume enclosed by outer conductor 12 and terminating wall 14 constitutes a cavity resonator, the resonant frequency of which can be adjusted in a known manner by moving tuning rings 17.

The diode package is connected to a direct-current bias source 18 by way of the inner conductor 13, a radio frequency choke 19, the outer conductor 12, and the end wall 14. Conductive bellows 21 is part of the circuit and constitutes a spring which facilitates mounting of the diode in the resonant cavity and insures good electrical contact.

The diode itself, contained within package 16, is not shown because it may take any of a number of forms well known in the art. The operation of the diode is as described previously and may typically be made of silicon, germanium, or gallium arsenide with three or more layers of varying conductivity. At the output microwave frequency, the cavity resonator applies a voltage to the diode terminals that is appreciably more than 90° out of phase with respect to the diode current. The output wave is transmitted by the coaxial cable to an appropriate load as shown by the arrow.

Figure 2:
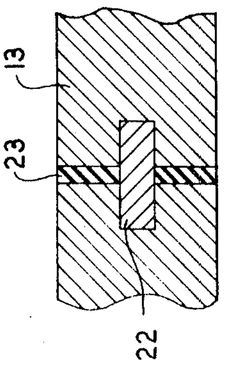

In accordance with the invention, a resistor 22 is embedded in the inner conductor 13 closely adjacent to the diode and is surrounded by an annular dielectric portion 23 which defines an annular capacitor. These elements are shown in larger scale in FIG. 2. The purpose of the resistor is to attenuate and suppress spurious low frequency oscillations which have been found to be responsible for a high incidence of IMPATT diode burnout. The purpose of the capacitor is to shunt the microwave current around the resistor at the output wave frequency.

In my study of silicon IMPATT diodes designed to generate output energy of 6 gigaHertz, I found that those diodes susceptible to burnout tended to generate relatively significant outputs in the VHF band, particularly between 50 and 150 megahertz. An appropriately designed resistor 22 will suppress such spurious low frequency oscillations and minimally affect the DC bias current, while the annular capacitor will shunt the output signal at 6 gigaHertz around the resistor.

I have found that for optimum suppression, the reactance of the capacitor should be made to be about equal to the parallel resistance of the resistor at the frequency to be suppressed. In devices which I have built, the resistor 22 is a 10 ohm resistor and the annular capacitor has a capacitance of 160 picofarads. At 100 megahertz this combination has an equivalent series impedance of $5+j.5$ ohms, while at 6 megahertz it will have a series impedance of only $0.00278+j.0.167$ ohms. Notice that at 100 megahertz the series resistance is almost 200 times as high as at 6 gigaHertz.

Experience has shown that with IMPATT diodes in general, the likelihood of catastrophic burnout can be reduced by including a resistor-capacitor combination that attenuates currents in the VHF frequency band. The invention may, however, be useful with other types of solid-state microwave oscillators. In designing circuits of this type, potentially deleterious low frequency components can be detected by examining the spectrum of output waves generated. I have found, however, that to give effective suppression, the resistor-capacitor must be located within the microwave cavity itself. If it is outside of the cavity, it usually cannot couple strongly enough to the oscillatory energy within the cavity to prevent the low frequency component from growing. While the invention is particularly useful in coaxial cables, it also can be used in strip lines and other two-conductor waveguide forms.

The foregoing is intended to be merely illustrative of the inventive concept. Various other embodiments and modifications may be make by those skilled in the art without departing from the spirit and scope of the invention.

What is claimed is:

1. In a microwave oscillator circuit of the type comprising a negative resistance diode connected to a conductor within a resonator, a voltage source connected to the conductor for biasing the diode, said resonator being resonant at a microwave frequency, said oscillator circuit generating a microwave output signal to be transmitted to an appropriate load, the improvement comprising:

a resistor included in the conductor closely adjacent to the diode and within the microwave resonator;

means comprising a bypass capacitor included in the conductor for shunting the microwave output signal current on the conductor around the resistor, while directing conductor current in the submicrowave frequency range through the resistor.

2. The oscillator circuit of claim 1 wherein:
the negative resistance diode is an IMPATT diode.

3. The oscillator circuit of claim 1 wherein:
the resonator is part of a two-conductor transmission line.

4. The oscillator circuit of claim 3 wherein:
the two-conductor transmission line is a coaxial cable having inner and outer conductors;
and the diode is connected to the inner conductor.

5. The oscillator circuit of claim 4 wherein:
the resistor is embedded in the conductor along the central axis of the inner conductor, and the capacitor comprises a dielectric annulus surrounding the resistor.

6. The oscillator circuit of claim 5 wherein:
the negative resistance diode is an IMPATT diode.

7. The oscillator circuit of claim 6 wherein:
the diode, during operation, is characterized by the generation of spurious submicrowave energy predominantly at the frequency $f$;
and the capacitive reactance of the capacitor at frequency $f$ is substantially equal to the resistance of the resistor shunting the capacitor.

8. The oscillator circuit of claim 7 wherein:
the microwave output frequency is approximately 6 gigaHertz, the frequency $f$ is approximately 100 megahertz, the series resistance of the resistor is substantially 10 ohms, and the capacitance of the capacitor is approximately 160 piccofarads.

* * * * *